United States Patent [19]

Horigome

[11] Patent Number: 5,013,676

[45] Date of Patent: May 7, 1991

[54] STRUCTURE OF MIS-TYPE FIELD EFFECT TRANSISTOR AND PROCESS OF FABRICATION THEREOF

[75] Inventor: Osamu Horigome, Tokyo, Japan

[73] Assignee: NEC Corporation, Tokyo, Japan

[21] Appl. No.: 367,071

[22] Filed: Jun. 16, 1989

Related U.S. Application Data

[63] Continuation-in-part of Ser. No. 186,863, Apr. 27, 1988, abandoned.

[30] Foreign Application Priority Data

Apr. 27, 1987 [JP] Japan .................................. 62-105057

[51] Int. Cl.$^5$ .................. H01L 21/265; H01L 21/443; H01L 21/66; H01L 27/00
[52] U.S. Cl. ........................................ 437/45; 357/23.6; 357/55; 437/38; 437/52; 437/47; 437/60; 437/203
[58] Field of Search ............... 357/23.6, 55; 365/149; 437/38, 52, 203, 54, 59, 60, 40, 44, 919, 191, 233, 235, 238, 241, 229, 78, 47, 45

[56] References Cited

U.S. PATENT DOCUMENTS

| | | | |
|---|---|---|---|
| 4,353,086 | 10/1982 | Jaccodine et al. | 357/51 |
| 4,435,899 | 3/1984 | Soclof | 437/38 |
| 4,466,180 | 8/1984 | Soclof | 437/203 |
| 4,497,685 | 2/1985 | Soclof | 437/38 |
| 4,503,598 | 3/1985 | Vora et al. | 437/203 |
| 4,630,088 | 12/1986 | Ogura et al. | 357/23.6 |
| 4,649,625 | 3/1987 | Lu | 437/38 |
| 4,670,768 | 6/1987 | Sunami et al. | 357/42 |
| 4,688,064 | 8/1987 | Ogura et al. | 357/23.6 |
| 4,716,548 | 12/1987 | Mochizuki | 357/23.6 |
| 4,717,942 | 1/1988 | Nakamura et al. | 357/23.6 |
| 4,728,623 | 3/1988 | Lu et al. | 437/52 |
| 4,734,384 | 3/1988 | Tsuchiya | 437/52 |
| 4,751,557 | 6/1988 | Sunami et al. | 357/23.6 |
| 4,761,385 | 8/1988 | Pfiester | 437/52 |
| 4,877,750 | 10/1989 | Okumura | 437/52 |

FOREIGN PATENT DOCUMENTS

| | | |
|---|---|---|
| 0085988 | 8/1983 | European Pat. Off. . |
| 0108390 | 5/1984 | European Pat. Off. . |
| 0118878 | 9/1984 | European Pat. Off. . |
| 0187596 | 12/1984 | European Pat. Off. . |
| 0176254 | 4/1986 | European Pat. Off. . |
| 0198590 | 10/1986 | European Pat. Off. . |
| 3508996 | 4/1984 | Fed. Rep. of Germany . |
| 0130178 | 12/1976 | Japan .................................. 357/23.6 |
| 0121081 | 9/1979 | Japan . |
| 0011365 | 1/1980 | Japan . |
| 0141262 | 8/1984 | Japan .................................. 357/59 |
| 0182161 | 9/1985 | Japan . |
| 0213053 | 10/1985 | Japan . |

Primary Examiner—Olik Chaudhuri
Assistant Examiner—M. Wilczewski
Attorney, Agent, or Firm—Sughrue, Mion, Zinn Macpeak & Seas

[57] ABSTRACT

For precise determination of a channel length of a MIS-type field effect transistor, two vertical cavities are formed spaced apart from each other by a land portion, two vertical portions of which provide source and drain regions formed by an ion implantation and spaced by a channel forming region doped with impurity atoms by an ion implantation for adjustment of the threshold voltage. In this way, the channel length is precisely determined during the formation of the source and drain regions since ion implantation allows better control of the edge profile than lithographic techniques provide.

9 Claims, 6 Drawing Sheets

STRUCTURE OF MIS-TYPE FIELD EFFECT TRANSISTOR AND PROCESS OF FABRICATION THEREOF

This is a continuation-in-part of application Ser. No. 07/186,863, filed Apr. 27, 1988, now abandoned.

FIELD OF THE INVENTION

This invention relates to a MIS-type field effect transistor and, more particularly, to the structure of an MIS-type field effect transistor and a fabrication process thereof.

BACKGROUND OF THE INVENTION

A typical structure of an MIS-type field effect transistor is provided with source and drain regions formed in a major surface portion of a semiconductor substrate in such a manner as to be spaced apart from each other by a channel region on which a gate insulator and a gate electrode are laminated for formation of a gate structure. The MIS-type field effect transistor thus formed has the source and drain regions and the channel region substantially coplanar with one another. As a result, impurity atoms are first implanted into the channel region for adjusting the threshold voltage thereof, which is followed by the formation of the gate structure consisting of the gate insulator and the gate electrode by using an appropriate lithography technique. Then, another ion implantation is carried out for formation of the source and drain regions using the gate structure as a mask. Using this process sequence, the threshold voltage should be adjusted before the determination of the channel length decided by the formation of the source and drain regions.

However, a problem is encountered in the prior art since the production yield deteriorates. This is because of the fact that a threshold voltage drift tends to take place due to the irregularity of the channel length of the MIS-type field effect transistor. If the MIS-type field effect transistor is designed to have a relatively short channel, the short-channel effect is liable to take place thus causing the irregularity of the channel length to strongly influences the drift of the threshold voltage. When the drift of the threshold voltage exceeds a predetermined range, the MIS-type field effect transistor is rejected as an inferior transistor, thereby diminishing the production yield. In the semiconductor manufacturing field, production yield is an extremely important factor in reducing the device cost, so that a solution has been sought to increase the production yield of the MIS-type field effect transistor.

SUMMARY OF THE INVENTION

It is therefore an important object of the present invention to provide a structure of a MIS-type field effect transistor which is less objectionable due to the mis-aligned gate electrode.

It is also an important object of the present invention to provide a process of fabricating the structure of the MIS-type field effect transistor in which the threshold voltage is less sensitive to the drift of the gate length.

It is still another important object of the present invention to provide a process of fabricating the structure of the MIS-type field effect transistor in which the threshold voltage is independently controllable.

To accomplish these objects, the present invention proposes to determine the amount of channel doping impurity atoms after measuring the actual channel length.

In accordance with one aspect of the present invention, a MIS-type field effect transistor is provided which is fabricated on a semiconductor substrate of a first conductivity type having a major surface, comprising, (a) a source/drain contacting electrode of a second conductivity type formed in the semiconductor substrate and having a side wall portion substantially normal to the major surface of the semiconductor substrate, the second conductivity type being opposite to the first conductivity type, (b) a land portion neighboring the source contacting electrode and having first and second vertical portions extending from the major surface of the semiconductor substrate, the first and second vertical portions being spaced apart from each other, the first vertical portion being in contact with the side wall portion of the source contacting electrode, (c) a source region of the second conductivity type formed in the first vertical portion in such a manner as to be in contact with the source/drain contacting electrode, (d) a drain region of the second conductivity type formed in the second vertical portion, (e) a channel region formed in a surface portion of the land portion in such a manner as to be capable of providing a conduction path between the source region and the drain region, (f) a gate insulating film formed on the channel region, and (g) a gate electrode formed on the gate insulating film.

The MIS-type field effect transistor may further comprise an upper electrode contacting the source contacting electrode.

In accordance with another aspect of the present invention, there is provided a process of fabricating a MIS-type field effect transistor comprising the steps of (a) preparing a semiconductor substrate of a first conductivity type, (b) forming a vertical cavity in the semiconductor substrate, the vertical cavity neighboring a land portion having a predetermined lateral distance, the land portion having first and second vertical portions spaced apart from each other by the predetermined lateral distance, the first vertical portion partially defining the vertical cavity, (c) forming source and drain regions in the first and second vertical portions of the land portion, respectively, (d) measuring a lateral distance between the source and drain regions, (e) filling the vertical cavity with a conductive material for forming a source/drain contacting electrode, (f) introducing impurity atoms into a surface portion of the land portion between the source and drain regions for adjustment of a threshold voltage of the MIS-type field effect transistor, the amount of the impurity atoms being determined in consideration of the lateral distance between the source and drain regions, (g) forming a gate insulating film on the surface portion of the land portion, and (h) forming a gate electrode on the gate insulating film.

The vertical cavity may be formed by an anisotropic etching using a mask layer, and the anisotropic etching may use a reactive etching technique. The source and drain regions may be formed by an ion implantation technique using a mask layer exposing the first and second vertical portions of the land portion, and the ion implantation may be preferably carried out after forming protective films each covering at least the first and second vertical portions of the land portion. The conductive material may be deposited by a chemical vapor deposition followed by an etch-back technique. The adjustment of the threshold voltage may be carried out by ion implantation using a mask layer exposing the surface portion of the land portion.

BRIEF DESCRIPTION OF THE DRAWINGS

The features and advantages of a structure of a MIS-type field effect transistor and a process of fabrication thereof according to the present invention will be more clearly understood from the following description taken in conjunction with the accompanying drawings in which.

DESCRIPTION OF THE PREFERRED EMBODIMENT

Figure 1:
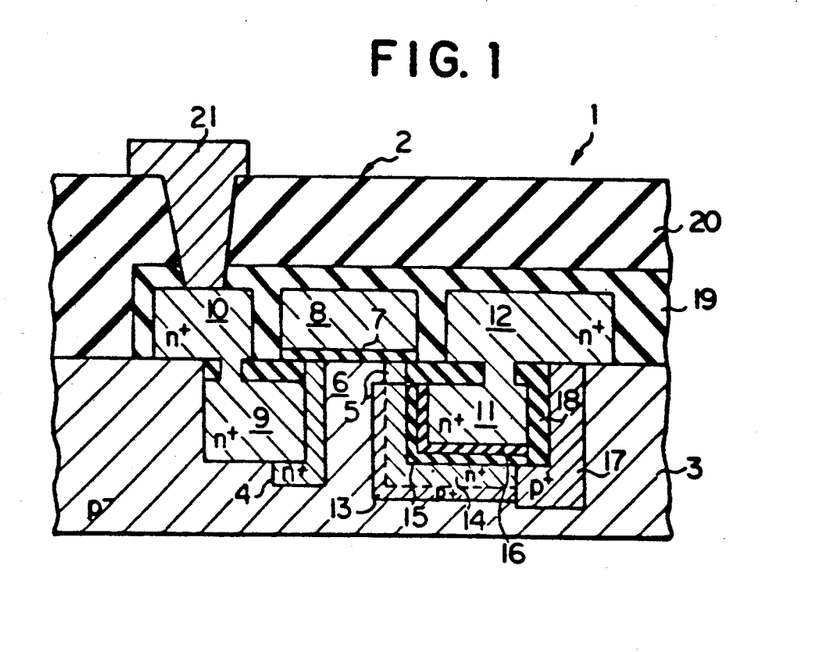
FIG. 1 is a cross sectional view showing the structure of a MIS-type field effect transistor embodying the present invention.

Referring first to FIG. 1 of the drawings, there the structure of a dynamic random access memory cell is shown having a storage capacitor 1 and a MIS-type field effect transistor 2 embodying the present invention. The MIS-type field effect transistor 2 is fabricated on a single crystal lightly-doped p-type silicon substrate 3.

The MIS-type field effect transistor 2 comprises an n-type source/drain region 4 vertically extending from a major surface of the silicon substrate 3, an n-type source/drain region 5 spaced apart from the source/drain region 4 by a channel region 6, a gate insulating film 7 of, for example, silicon dioxide formed on the channel region 6 and a gate electrode 8 of, for example, n-type doped polysilicon, and an n-type source/drain contacting lower electrode 9 which is in contact with an upper electrode 10 of, for example, n-type doped polysilicon.

On the other hand, the storage capacitor 1 comprises an n-type lower capacitor electrode 11 which is in contact with an upper electrode 12 of, for example, n-type doped polysilicon, and the lower capacitor electrode 11 forms part of a MOS capacitor. The storage capacitor 1 further comprises a junction-type capacitor consisting of a heavily-doped p-type portion 13 and a heavily-doped n-type portion 14 making contact with each other or forming a p-n junction therebetween. A dielectric film structure is provided with a silicon nitride film 15 and a silicon dioxide film 16 laminated in succession on the n-type portion 14 and the heavily-doped n-type portion 14. The dielectric film structure and the lower capacitor electrode 11 in combination form the MOS capacitor. In this way, the capacitance of the storage capacitor is increased by using the combination of the MOS capacitor and the junction type capacitor. A heavily-doped p-type channel stopper region 17 is formed in the vicinity of the junction type capacitor 2. For providing an isolation, a silicon dioxide film 18 is formed between the lower capacitor electrode 11 and the channel stopper region 17. The gate electrode 8 and the upper electrodes 10 and 12 are covered with a silicon dioxide film 19 which in turn is covered with a phosphosilicate glass film 20, and an aluminum interconnection 21 passes through the silicon dioxide film 19 and the phosphosilicate glass film 20 and is in contact with the upper electrode 10 of the MIS-type field effect transistor 2.

A fabrication process starts with a single crystal lightly-doped p-type silicon substrate 31. On the major surface of the silicon substrate 31, silicon nitride is deposited by using a chemical vapor deposition technique to form a silicon nitride film 32 which is partially removed by lithographic techniques to form two openings 33 and 34 spaced apart from each other by a distance D1 slightly longer than a gate length of a MIS-type field effect transistor. After patterning of the silicon nitride film 32, the silicon substrate 31 is anisotropically etched away by a reactive ion etching technique, so that two vertical cavities are formed in the silicon substrate 31 and are spaced apart from each other by a land portion with a horizontal distance substantially equal to the distance D1 between the openings 33 and 34, as will be seen from FIG. 2A.

Figure 2A:
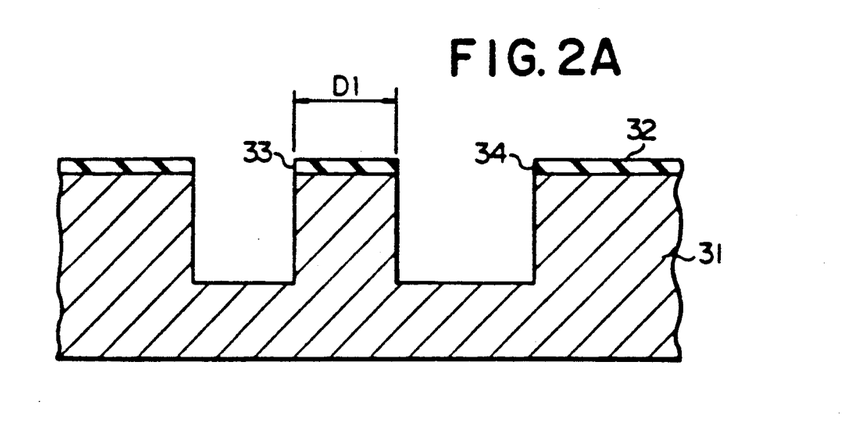
FIGS. 2A, 2A-II, 2A-III, 2A-IV, 2B, 2C, 2C-II to 2F are cross sectional views each showing an essential step of a process used for fabrication of the structure of the MIS-type field effect transistor illustrated in FIG. 1.
Figure 2B:
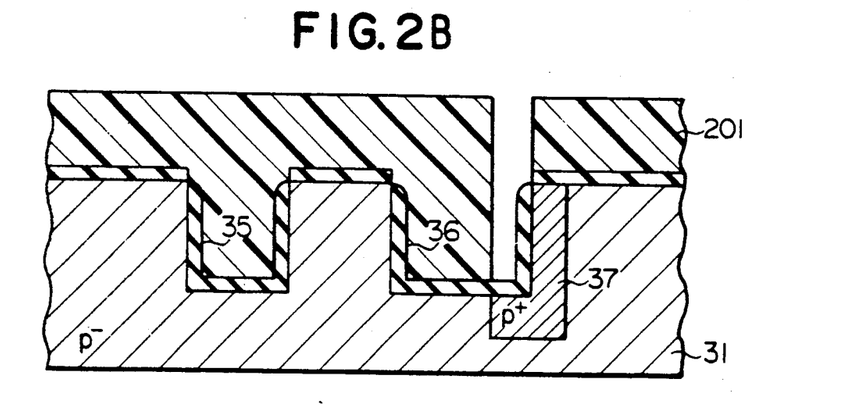

Subsequently, the silicon substrate 31 is placed in an oxidation ambient to form silicon oxide films 35 and 36 on wall portions of the silicon substrate 31, respectively, each defining the vertical cavity. The silicon oxide films 35 and 36 protect the silicon crystal from damage due to ion implantation performed in a later stage and prevent the implanted impurity atoms from out-diffusion. A photoresist material is spun onto the entire surface of the structure and is patterned to form a mask layer 201 which exposes a channel stopper forming region by using lithographic techniques (as will be seen from FIG. 2A-II), and, then, boron atoms are implanted into the channel stopper forming region, thereby forming a heavily doped p-type channel stopper region 37. The mask layer used for formation of the channel stopper region 37 is stripped off, and another mask layer 202 is formed on the entire surface of the structure in a similar manner to the mask layer for the channel stopper region 37 (as will be seen from FIG. 2A-III). The mask 202 is patterned at the submicron level by using a deep ultraviolet light. The mask 202 is patterned to expose source/drain forming regions and serves as a mask layer for the formation of source and drain regions of the MIS-type field effect transistor. Then, n-type impurity atoms such as, for example, phosphorus atoms are implanted into the source/drain forming regions, so that the n-type source/drain regions 38 and 39 are formed in respective vertical wall portions of the land portion between the vertical cavities. As illustrated in FIG. 2A-III, since only the source/drain forming regions are uncovered with the mask 202, the implanted atoms are doped into the source/drain regions, and, the projection range is decided by adjusting the implantation energy. The vertical wall portions are located on the opposite sides of the land portion, and a channel forming region intervenes between the n-type source/drain regions 38 and 39. The channel forming region thus formed has a length D2 determined by the ion implantation for the source/drain regions 38 and 39 and the length D2 is measured by using an optical device, so that the MIS-type field effect transistor according to the present invention can have a channel region with a precisely measured length. A lower portion of the source/drain region 39 provides a junction-type storage capacitor, so that p-type impurity atoms such as, for example, boron atoms are implanted to form a p-type portion 40, and the n-type impurity atom implantation is repeated to form an n-type portion 41, thereby forming in combination the junction type storage capacitor. Namely, after the mask 202 is stripped off, a negative type photoresist film 203 is coated on the entire surface of the structure, and a positive type photoresist film 204 is then provided on the photoresist film 203. Thus, the structure is coated with a multiple-photoresist structure consisting of the photoresist films 203 and 204, and the structure is exposed to an oblique light radiation as indicated by arrows in FIG. 2A-IV. The negative type photoresist film 203 is sensitive to the light and becomes solid by the application of light radiation, however, the multiple-photoresist structure on the top surface interrupts the light radiation, so that photoresist film 203 in the bottom portion of the vertical cavity is not exposed to the light. For this reason, the photoresist film 203 is partially removed from the bottom portion of the vertical cavity, and, accordingly, a mask is formed on the substrate 31. Then, p-type impurity atoms such as boron atoms are ion-implanted into the bottom portion of the vertical cavity, and p-type impurity atoms such as arsenic atoms are thereafter ion-implanted into the same bottom portion. When the substrate 31 is placed in a high ambient temperature, the implanted atoms are diffused into the substrate to form the p-type portion 40 and the n-type portion 41. Since the boron atoms have a larger diffusion coefficient than the arsenic atoms, the p-type portion 40 extends widely in comparison with the n-type portion 41. The resultant structure is illustrated in FIG. 2B.

Figure 2C:
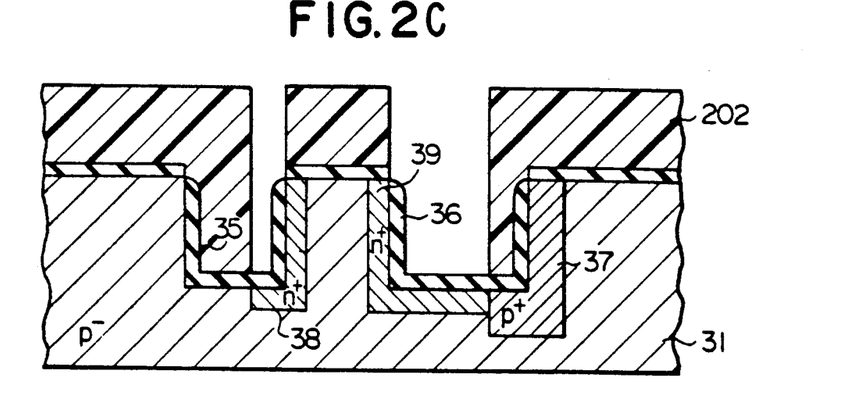

The silicon dioxide films are removed by using a hydrofluoric acid solution, so that a fresh major surface of the silicon substrate 31 is exposed. On the fresh major surface of the silicon substrate 31, a silicon nitride film 42 and a silicon dioxide film 43 are successively deposited and the silicon nitride film 42 and the silicon dioxide film 43 are successively patterned by using lithographic techniques, thereby providing a dielectric film structure as shown in FIG. 2C-II. The other vertical cavity 211 was not covered with a mask (not shown) in the lithographic process, so that no dielectric film structure is formed in the other vertical cavity 211. The dielectric film structure is thin enough to form secondary vertical cavities which are filled with a phosphorus-doped polysilicon by using chemical vapor deposition. Another advantage of the thin dielectric film structure is a large capacitance produced by the conductors which sandwich the dielectric film structure. After the deposition of the phosphorus-doped polysilicon, the entire surface of the structure is covered with the polysilicon, so that the deposited polysilicon is uniformly removed by using an etch-back technique until the silicon nitride film 32 is exposed. The polysilicon blocks in the secondary vertical cavities provide a source contacting lower electrode 44 and a lower capacitor electrode 45, respectively. The resultant structure of this stage is illustrated in FIG. 2C.

Figure 2D:
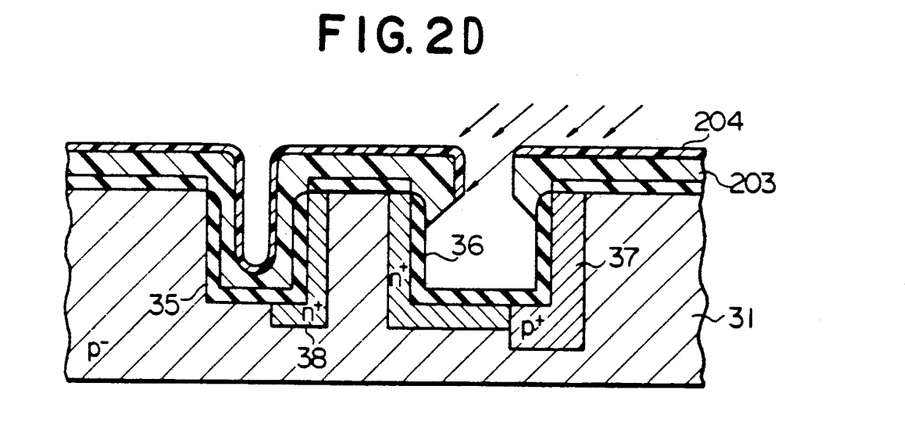

A photoresist material is spun onto the entire surface of the structure to form a photoresist film which is patterned to expose a part of the lower capacitor electrode 45 in the vicinity of the channel stopper region 37. Then, a reactive etching technique is applied to the exposed part of the lower capacitor electrode 45, so that a narrow vertical cavity is formed between the lower capacitor electrode 45 and the channel stopper region 37. After formation of the narrow vertical cavity, the polysilicon blocks are thermally oxidized to form a silicon dioxide films 46 and 47, and the silicon dioxide film 47 provides an electrical isolation between the lower capacitor electrode 44 and the channel stopper region 37. The silicon dioxide film 47 also prevents the phosphorus atoms doped in the lower capacitor electrode 45 from undesirable diffusion. The resultant structure of this stage is illustrated in FIG. 2D.

Figure 2E:
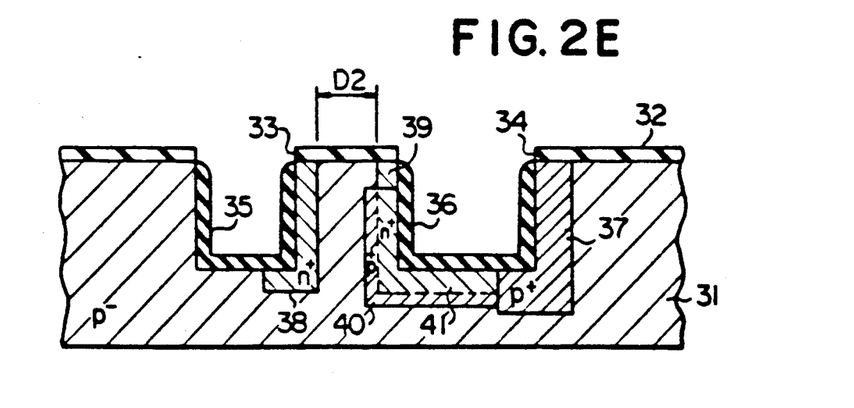

The silicon nitride film 32 is then stripped off to expose a fresh major surface of the silicon substrate 31 including the channel forming region with the length D2. A thin oxide film 48 is thermally grown on the channel forming region for protection of the silicon crystal, and a photoresist material is applied and patterned to form a mask layer 49 exposing the channel forming region. Then, impurity atoms are doped into the channel forming region by ion implantation so as to adjust the threshold voltage of the MIS-type field effect transistor, thereby forming a channel region 50 between the source/drain regions 38 and 39, as will be seen from FIG. 2E. The impurity atoms are of the n-type and are identical to the impurity atoms implanted into the source and drain regions 38 and 39, and the electrodes 44 and 45 are covered with the silicon dioxide films 46 and 47, so that no precise alignment is required for the mask layer 49. In another implementation, no mask layer is provided for the channel doping. In the channel doping step, the amount of the doped impurity atoms is adjusted on the basis of the measured channel length D2, so that it is easy to adjust the threshold voltage of the MIS-type field effect transistor by considering the short channel effect.

Figure 2F:
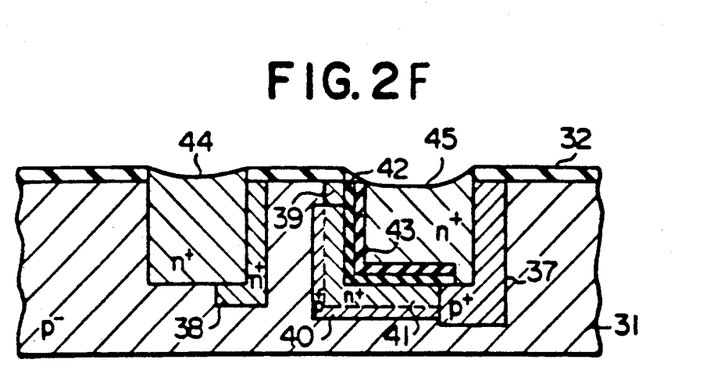
Figure 2G:
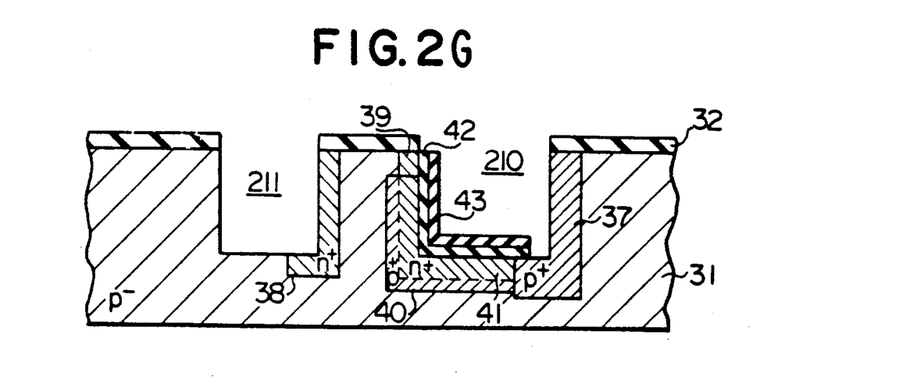
Figure 2H:
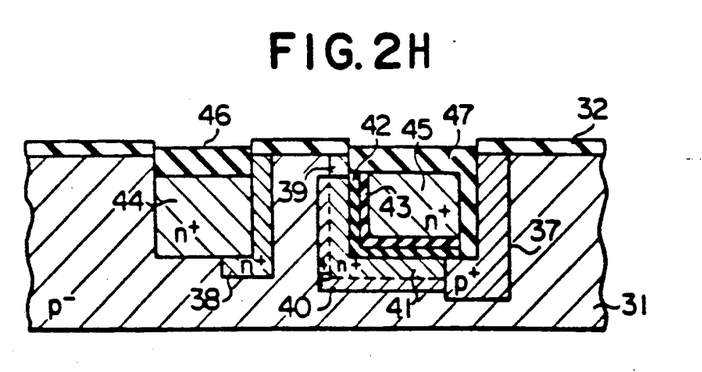
Figure 2I:
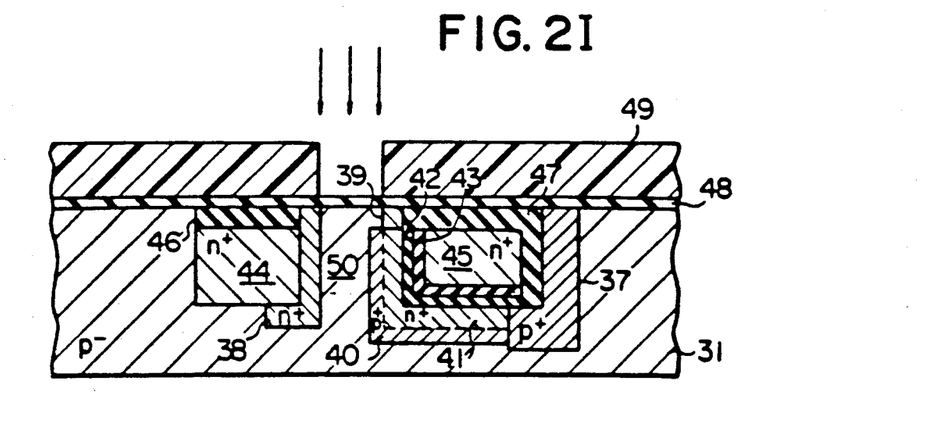
Figure 2J:
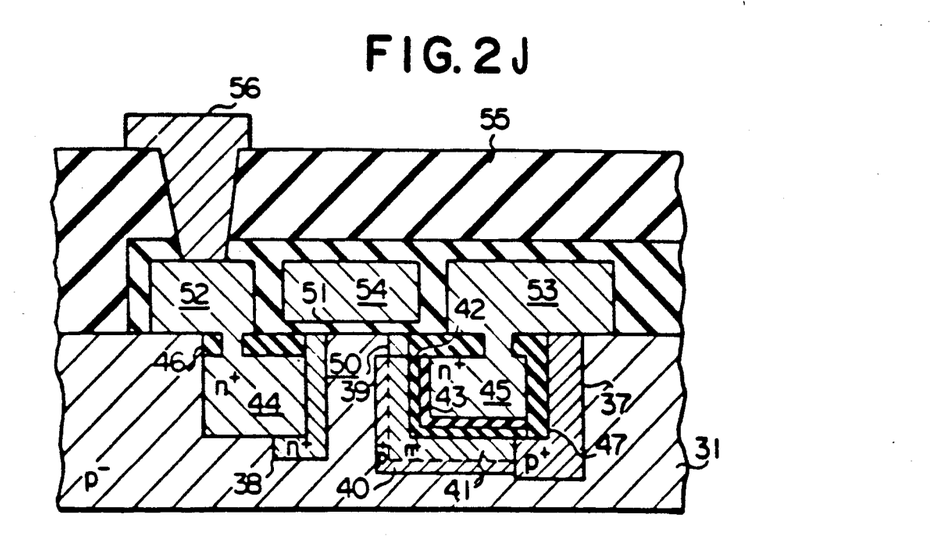

After formation of the channel region 50, the mask layer 49 and the thin oxide film 48 are removed to expose a fresh major surface again, and the silicon substrate 31 is placed in an oxidation ambient to thermally form a silicon dioxide film. The silicon dioxide film is patterned to provide a gate oxide film 51 on the channel region 50 by using lithographic techniques. Subsequently, the silicon dioxide films 46 and 47 are partially removed to form contact holes exposing the source contacting lower electrode 44 and the lower capacitor electrode 45 by using lithographic techniques, and, thereafter, a doped polysilicon is deposited on the entire surface of the structure. By virtue of the contact holes formed in the silicon dioxide films 46 and 47, the deposited polysilicon is contacted to the source contacting lower electrode 44 and the lower capacitor electrode 45 and extends over the gate oxide film 51. The silicon substrate 31 is placed in a high temperature ambient to diffuse the phosphorus atoms doped in the polysilicon into the source contacting lower electrode 44 and the lower capacitor electrode 45, thereby improving the electric contacts between the polysilicon and the source contacting electrode 44 and the lower capacitor electrode 45. Then, appropriate mask layer is applied on the deposited polysilicon film, and the deposited polysilicon film is patterned to form a source contacting upper electrode 52, an upper electrode 53 and a gate electrode 54. After formation of isolation film on the electrodes 52 to 54, a phosphosilicate glass film 55 is deposited over the entire surface of the structure, and an aluminum interconnection 56 is formed in such a manner as to contact the source contacting upper electrode 52, thereby completing a dynamic random access memory cell provided with the MIS-type field effect transistor according to the present invention and the storage capacitor as seen from FIG. 2F.

As will be understood from the foregoing description, the process is advantageous over the prior art in that the channel length is precisely measured before channel doping for adjustment of the threshold voltage of the MIS-type field effect transistor. The process of the present invention is further advantageous in recovering inferior products because the adjustment of the threshold voltage is carried out after measuring the channel length.

Moreover, the structure of the MIS-type field effect transistor is incorporated in a dynamic random access memory cell together with a storage capacitor. The heat-treatment is carried out for not only the source and drain regions of the MIS-type field effect transistor but also the junction-type capacitor, so that the required number of process steps in the present invention is reduced in comparison with a prior art process which needs heat-treatments separately carried out for the source and drain regions and the junction-type capacitor, respectively. Further, the MIS structure of the present invention has an isolation oxide film 47 formed by the thermal oxidation, so that no isolation region formed by the LOCOS techniques is needed. The LOCOS techniques usually consist of five to ten process steps, thus the isolation oxide film 47 is advantageously simple. The upper electrodes 52 and 53 of polysilicon are simultaneously formed and provide smooth top surfaces, so that the aluminum interconnection 56 is free from destruction, which is another advantage of the present invention.

Although particular embodiments of the present invention have been shown and described, it will be obvious to those skilled in the art that various changes and modifications may be made without departing from the spirit and scope of the present invention.

What is claimed is:

1. A process of fabricating a single MIS-type field effect transistor comprising the steps of:
    (a) preparing a semiconductor substrate of a first conductivity type;
    (b) forming two vertical cavities in said semiconductor substrate, a land portion with a predetermined lateral distance being formed between said two vertical cavities, said land portion having first and second vertical portions spaced apart from each other by said predetermined lateral distance, said first and second vertical portions partially defining said vertical cavities, respectively;
    (c) forming source and drain regions in the first and second vertical portions of said land portion, respectively;
    (d) measuring a lateral distance between said source and drain regions by using an optical device;
    (e) filling said vertical cavities with an oxidizable conductive material for forming source/drain contacting electrodes;
    (f) introducing impurity atoms into a surface portion of said land portion between said source and drain regions for adjustment of a threshold voltage of said single MIS-type field effect transistor;
    (g) forming a gate insulating film on said surface portion of said land portion; and
    (h) forming a gate electrode on said gate insulating film, in which said step (b) comprises the sub-steps of
    (b-1) covering a surface of said semiconductor substrate with a non-oxidizable insulating film, (b-2) partially removing said non-oxidizable insulating film for exposing portions of said surface, the surface portion of said land portion being covered with said non-oxidizable film, and (b-3) forming said vertical cavities in said portions to be exposed, respectively, and in which said step (f) comprises the sub-steps of (f-1) oxidizing surface portions of said source/drain contacting electrodes for forming oxide films, respectively, (f-2) removing said non-oxidizable insulating film so as to expose the surface portion of said land portion, and (f-3) implanting said impurity atoms into the surface portion of said land portion.

2. A process of fabricating a MIS-type field effect transistor as set forth in claim 1, in which portions of said semiconductor substrate are anisotropically etched away by using a mask layer to form said vertical cavities.

3. A process of fabricating a MIS-type field effect transistor as set forth in claim 2, in which the portions of said semiconductor substrate are etched away by using a reactive ion etching technique.

4. A process of fabricating a MIS-type field effect transistor as set forth in claim 1, in which said source and drain regions are formed by an ion implantation technique using a mask layer exposing the first and second vertical portions of said land portion.

5. A process of fabricating a MIS-type field effect transistor as set forth in claim 4, in which said ion implantation is carried out after forming protective films each covering at least the first and second vertical portions of said land portion.

6. A process of fabricating a MIS-type field effect transistor as set forth in claim 1, in which said conductive material is deposited by a chemical vapor deposition followed by an etch-back technique.

7. A process of fabricating a MIS-type field effect transistor as set forth in claim 1, in which said adjustment of said threshold voltage is carried out by using an ion implantation using a mask layer having an opening not smaller in area than said surface portion of said land portion, thereby fully exposing said surface portion.

8. A process of fabricating a MIS-type field effect transistor as set forth in claim 1, in which said gate insulating film is thermally grown on the surface portion of said land portion.

9. A process of fabricating a MIS-type field effect transistor as set forth in claim 1, in which said gate electrode is formed by a chemical vapor deposition followed by lithographic techniques.

* * * * *

UNITED STATES PATENT AND TRADEMARK OFFICE
CERTIFICATE OF CORRECTION

PATENT NO. : 5,013,676

DATED : May 7, 1991

INVENTOR(S) : Osamu Horigome

It is certified that error appears in the above-identified patent and that said Letters Patent is hereby corrected as shown below:

Col. 3, line 14, delete "2A, 2A-II, 2A-III, 2A-IV, 2B, 2C, 2C-II to 2F" and insert --2A to 2J--;

Col. 4, line 28, delete "2A-II" and insert --2B--;

Col. 4, line 35, delete "2A-III" and insert --2C--;

Col. 4, line 45, delete "2A-III" and insert --2C--;

Col. 5, line 5, delete "2A-IV" and insert --2D--;

Col. 5, line 25, delete "2B" and insert --2E--;

Col. 5, line 34, delete "2C-II" and insert --2G--;

Col. 5, line 52, delete "2C" and insert --2F--;

Col. 6, line 2, delete "2D" and insert --2H--;

Col. 6, line 15, delete "2E" and insert --2I--;

UNITED STATES PATENT AND TRADEMARK OFFICE
CERTIFICATE OF CORRECTION

PATENT NO. : 5,013,676

DATED : May 7, 1991

INVENTOR(S) : Osamu Horigome

It is certified that error appears in the above-identified patent and that said Letters Patent is hereby corrected as shown below:

Col. 6, line 62, delete "2F: and isnert --2J--.

Signed and Sealed this

Twentieth Day of October, 1992

Attest:

DOUGLAS B. COMER

*Attesting Officer*  *Acting Commissioner of Patents and Trademarks*